(12) United States Patent
Horikawa et al.

(10) Patent No.: US 7,431,785 B2
(45) Date of Patent: Oct. 7, 2008

(54) MANUFACTURING METHOD FOR MONOLITHIC PIEZOELECTRIC PART, AND MONOLITHIC PIEZOELECTRIC PART

(75) Inventors: Katsuhiro Horikawa, Omihachiman (JP); Tomoyuki Ogawa, Toyama-ken (JP)

(73) Assignee: Murata Manufacturing Co., Ltd. (JP)

( * ) Notice: Subject to any disclaimer, the term of this patent is extended or adjusted under 35 U.S.C. 154(b) by 466 days.

(21) Appl. No.: 10/624,537

(22) Filed: Jul. 23, 2003

(65) Prior Publication Data

US 2004/0129919 A1 Jul. 8, 2004

(30) Foreign Application Priority Data

Jul. 25, 2002 (JP) ............................. 2002-216120
Jan. 9, 2003 (JP) ............................. 2003-002988

(51) Int. Cl.
C03B 29/00 (2006.01)
B32B 37/06 (2006.01)
H01L 41/187 (2006.01)
C04B 35/491 (2006.01)

(52) U.S. Cl. ............................. 156/89.14; 156/89.17
(58) Field of Classification Search ............ 156/89.12, 156/89.14, 89.16, 89.17; 264/618, 674, 676; 252/62.9 PZ; 501/134, 136
See application file for complete search history.

(56) References Cited

U.S. PATENT DOCUMENTS

| | | | | |
|---|---|---|---|---|
| 6,080,328 | A * | 6/2000 | Horikawa | 252/62.9 PZ |
| 6,221,271 | B1 * | 4/2001 | Watanabe et al. | 252/62.9 PZ |
| 6,280,650 | B1 * | 8/2001 | Ogawa et al. | 252/62.9 PZ |
| 6,383,408 | B1 * | 5/2002 | Horikawa et al. | 252/62.9 PZ |
| 6,391,814 | B1 * | 5/2002 | Tsubokura et al. | 501/136 |
| 2001/0045792 | A1 * | 11/2001 | Takeshima | 310/340 |
| 2002/0043642 | A1 * | 4/2002 | Tanimoto et al. | 252/62.9 PZ |
| 2002/0079622 | A1 * | 6/2002 | Randall et al. | 264/618 |
| 2002/0098333 | A1 * | 7/2002 | Feltz et al. | 428/210 |
| 2004/0012000 | A1 * | 1/2004 | Ponomarev et al. | 252/500 |

(Continued)

FOREIGN PATENT DOCUMENTS

JP 60-103079 6/1985

(Continued)

OTHER PUBLICATIONS

Japanese Examination Report dated Jan. 11, 2005 (and English translation of same).

*Primary Examiner*—Melvin C Mayes
(74) *Attorney, Agent, or Firm*—Dickstein, Shapiro, LLP.

(57) ABSTRACT

A monolithic piezoelectric part capable of yielding a high piezoelectric d constant and suppressing reduction in reliability such as deterioration in insulation resistance can be obtained by a method for manufacturing a monolithic piezoelectric part wherein a piezoelectric ceramic body is formed of a perovskite compound oxide expressed by the general formula of $ABO_3$, and the molar quantity of the A site component, Pb, is reduced by about 0.5 mol % to 5.0 mol % from that of the stoichiometric composition, ceramic raw materials are combined so that the average valence of the B site component is greater than quadrivalent, which is the same as the stoichiometric composition, to synthesize the ceramic powdered raw material, which is processed subsequently to fabricate a layered article, and the layered article is subjected to sintering processing within an atmosphere wherein the oxygen concentration is about 5% or less but more than 0% by volume.

20 Claims, 3 Drawing Sheets

U.S. PATENT DOCUMENTS

2004/0051423 A1 * 3/2004 Florian .................. 310/328

FOREIGN PATENT DOCUMENTS

| JP | 02-122505 | | 5/1990 |
| JP | 02-122511 | | 5/1990 |
| JP | 2-122511 | * | 5/1990 |
| JP | 02-122598 | | 5/1990 |
| JP | 06-252-618 | | 9/1994 |
| JP | 8-151262 | | 6/1996 |
| JP | 2676620 | | 7/1997 |
| JP | 10-163779 | | 6/1998 |
| JP | 11-163433 | * | 6/1999 |
| JP | 11-274595 | | 10/1999 |
| JP | 2001-181035 | * | 7/2001 |
| JP | 2001-302348 | | 10/2001 |
| JP | 2002-193666 | | 7/2002 |
| WO | WO-02/055450 | | 7/2002 |

* cited by examiner

MANUFACTURING METHOD FOR MONOLITHIC PIEZOELECTRIC PART, AND MONOLITHIC PIEZOELECTRIC PART

BACKGROUND OF THE INVENTION

1. Field of the Invention

The present invention relates to a method for manufacturing a monolithic piezoelectric part and the monolithic piezoelectric part itself, and more particularly, relates to a method for manufacturing a monolithic piezoelectric part such as a monolithic piezoelectric actuator, a monolithic piezoelectric audio emitter or a monolithic piezoelectric sensor, wherein the layers are reduced in thickness and increased in number, and a high piezoelectric d constant (distortion constant) is required, and the monolithic piezoelectric part manufactured by the above method.

2. Description of the Related Art

In recent years, piezoelectric parts such as piezoelectric actuators, piezoelectric audio emitters, piezoelectric sensors, piezoelectric transformers, and so forth, which use the piezoelectric properties of ceramic materials, have come into widespread use for mobile communication equipment, audio-visual equipment, office automation equipment, and so forth.

Further, recent development of monolithic piezoelectric parts is being actively undertaken from the perspective of reducing the size of electronic parts and improving the piezoelectric properties thereof, and particularly, attempts are being made to reduce the size of electronic parts and improve the piezoelectric properties thereof by reducing the thickness of the layers of the ceramic sheets which make up the monolithic piezoelectric parts and increasing the number of the ceramic sheets.

However, internal electrode materials such as Ag disperse within the ceramic body with arrangements wherein the layers of monolithic piezoelectric parts are reduced in thickness or increased in number, leading to deterioration of the piezoelectric properties thereof and poorer reliability.

To deal with this problem, a technique wherein a ceramic other than a piezoelectric article and a material for internal electrodes are sintered together in a low-oxygen atmosphere has been proposed as a method for suppressing dispersion of the internal electrode material such as Ag within the ceramic body (Japanese Patent No. 2,676,620, Japanese Examined Patent Application Publication No. 6-20014, Japanese Unexamined Patent Application Publication No. 2-122598).

The aforementioned documents disclose a sintering process in a low-oxygen atmosphere (e.g., with oxygen concentration of 50,000 ppm or lower) which reduces the activation of Ag serving as the internal electrode material, and thus suppresses dispersion of Ag to the ceramic body at the time of sintering.

Also, a technique has been proposed wherein the amount of Ag dispersed is controlled by the concentration of oxygen within the furnace at the time of sintering. (Japanese Unexamined Patent Application Publication No. 11-163433 and Japanese Unexamined Patent Application Publication No. 11-274595).

These documents disclose a hard-type piezoelectric ceramic material with a small piezoelectric d constant and a high mechanical quality coefficient Qm as a material for a piezoelectric transformer or the like, wherein good transformer properties are obtained by making the A site component volume of the perovskite compound oxide expressed with a general formula of $ABO_3$ greater than that of a stoichiometric composition, using an internal electrode material wherein the ratio by weight of Ag and Pd is within the range of 60/40 to 80/20 for Ag/Pd, and sintering within an atmosphere wherein the oxygen concentration is 1% or more.

However, in the event that the technique disclosed in Japanese Patent No. 2,676,620, Japanese Examined Patent Application Publication No. 6-20014 and Japanese Unexamined Patent Application Publication No. 2-122598 is applied to a Pb perovskite piezoelectric ceramic material, the piezoelectric d constant is conspicuously deteriorated since sintering within a low-oxygen atmosphere promotes generation of oxygen pores. Particularly, deterioration of the piezoelectric d constant is so remarkable when the oxygen concentration is reduced to less than 1% by volume (hereafter, the unit "% by volume" will be represented by "vol %") or when a soft piezoelectric ceramic material with a high piezoelectric d constant is used, that its application to monolithic piezoelectric parts such as monolithic piezoelectric actuators, monolithic piezoelectric audio emitters, monolithic piezoelectric sensors, or the like, wherein a high piezoelectric d constant is required is difficult.

In Japanese Unexamined Patent Application Publication No. 11-163433 and Japanese Unexamined Patent Application Publication No. 11-274595, an internal electrode material wherein the ratio by weight of Ag and Pd is within the range of 60/40 to 80/20 for Ag/Pd is used, but in the event that the amount of Ag, which is less expensive than Pd, is increased to 80% by weight (hereafter, "% by weight" will be represented by "wt %") in order to reduce the cost of the electrode material, the amount of Ag dispersion also increases, so that formation of oxygen pores is promoted and the piezoelectric d constant and the insulation resistance are probably deteriorated.

While Japanese Unexamined Patent Application Publication No. 11-163433 and Japanese Unexamined Patent Application Publication No. 11-274595 disclose a monolithic piezoelectric transformer obtained by layering ceramic sheets of 80 to 100 μm in thickness, further reduction in thickness of the ceramic sheets also increases the amount of Ag dispersion, which leads to further deterioration of the piezoelectric properties and the insulation resistance. These publications also disclose use of a hard-type piezoelectric ceramic material with a high mechanical quality coefficient Qm since the primary object is a piezoelectric transformer, but a piezoelectric actuator, a piezoelectric audio emitter, a piezoelectric sensor, and so forth, require use of a soft piezoelectric ceramic material with a high piezoelectric d constant. However, there has been the problem that with such soft piezoelectric ceramic materials, when the amount of Ag contained in the internal electrode material is increased, the thickness of the layers of ceramic sheets is reduced or the number of the layers thereof is increased, formation of oxygen pores is further promoted by dispersion of Ag within the piezoelectric ceramic particles and sintering within a low-oxygen atmosphere, to result in a marked reduction in the piezoelectric d constant.

SUMMARY OF THE INVENTION

The present invention has been made in light of such problems, and its object is to provide a method for manufacturing monolithic piezoelectric parts wherein a high piezoelectric d constant can be obtained and reduction in reliability such as deterioration in insulation resistance can be suppressed even when layers are reduced in the thickness or increased in the number, or an internal electrode material containing a high percentage of Ag is used, and a highly reliable monolithic piezoelectric part with excellent piezoelectric properties.

Committed research by the present inventors to achieve the above objects revealed that using perovskite compound oxide expressed by a general formula of $ABO_3$, generating a piezoelectric ceramic powdered raw material wherein the molar quantity of the A site component has been reduced by about 0.5 mol % to 5.0 mol % from that of the stoichiometric composition, then fabricating a layered article with the piezoelectric ceramic powdered raw material, and subjecting this to sintering processing within an atmosphere wherein the oxygen concentration is about 5.0% by volume or less, allows a monolithic piezoelectric part with a high piezoelectric d constant as well as a good reliability to be obtained even in the event of reducing the thickness or increasing the number of layers of the ceramic green sheets, or using an internal electrode material containing Ag at about 80 wt % or higher.

The present invention has been made based on such a standpoint, and the method for manufacturing a monolithic piezoelectric part according to the present invention is a method for manufacturing a monolithic piezoelectric part which has a plurality of piezoelectric ceramic layers and internal electrode layers disposed with the piezoelectric ceramic layers introduced therebetween, wherein the piezoelectric ceramic making up the piezoelectric ceramic layers is formed of a perovskite compound oxide expressed by a general formula of $ABO_3$, containing at least Pb for the A site component and at least Ti for the B site component; the method comprises the steps of: a powdered raw material generation step for generating a piezoelectric ceramic powdered raw material wherein the molar quantity of the A site component has been reduced by about 0.5 mol % to 5.0 mol % from that of the stoichiometric composition, a layered article fabrication step for fabricating a layered article with the piezoelectric ceramic powdered raw material, and a sintering step for subjecting the layered article to sintering processing within an atmosphere wherein the oxygen concentration is about 5% by volume or less but more than 0% by volume.

According to this manufacturing method, reduction in the molar quantity of the A site component by a predetermined amount forms pores (A site loss) at A site component positions, whereby oxygen pores formed by sintering in the low-oxygen atmosphere and by dispersion of the internal electrode material are compensated for by the A site loss, to suppress reduction in the piezoelectric d constant.

Also, committed research by the present inventors revealed that the use of a piezoelectric ceramic powdered raw material wherein ceramic raw materials have been prepared so that the average valence of the B site component is greater than that of the stoichiometric composition allows a monolithic piezoelectric part with an even higher piezoelectric d constant as well as an excellent insulation resistance to be obtained.

That is to say, in the powdered raw material generation step of the method for manufacturing a monolithic piezoelectric part according to the present invention, the ceramic raw material making up the A site component and the ceramic raw material making up the B site component may be combined so that the average valence of the B site component is greater than that of the stoichiometric composition.

Also, in the method for manufacturing a monolithic piezoelectric part according to the invention, the B site component may further contain Ti, Zr, and ions other than Ti and Zr with the piezoelectric ceramic powdered raw material generated by controlling the average valence of the B site component so as to satisfy Expression 2, $$4.000 < \frac{\sum_{n=1}^{i} a_n b_n}{\sum_{n=1}^{i} b_n} < 4.100$$

wherein the valence of ions $M_n$ (n =1, 2, 3, ..., i) included in the B site component is represented as $a_n$(n =1, 2, 3, ..., i), and the molar ratio of $M_n$ is represented as $b_n$(n =1, 2, 3, ..., i).

According to this manufacturing method, the average valence of the B site component is greater than quadrivalent which is the stoichiometric composition, but less than about 4.100, so the A site loss can be formed more effectively with no loss in sinterability, and the A site loss compensates for the dispersion of Ag and the oxygen pores generated by sintering in the low-oxygen atmosphere, whereby reduction in the piezoelectric d constant and deterioration of the insulation resistance can be suppressed even more effectively.

Also with the method for manufacturing a monolithic piezoelectric part according to the present invention, the molar quantity of Pb included in the A site component may be reduced by about 0.5 mol % to 5.0 mol % from that of the stoichiometric composition in the powdered raw material generation step.

According to this manufacturing method, the pores are formed at the Pb position of the crystal structure (hereafter, these pores will be referred to as "Pb pores") by reducing the molar quantity of Pb by a predetermined amount, and the Pb pores compensate for the oxygen pores generated by sintering in the low-oxygen atmosphere and dispersion of the internal electrode material, whereby reduction in the piezoelectric d constant can be suppressed.

Moreover, the B site component may also contain Nb, or the B site component may contain also Nb and Ni in the method for manufacturing a monolithic piezoelectric part according to the present invention.

Thus, inclusion of quinquevalent Nb as a donor ion, or suitable preparation of the amount of quinquevalent Nb and bivalent Ni so as to have a donor excess effect allows the average valence of the B site component to be greater than quadrivalent, thereby promoting formation of Pb pores compensating for oxygen pores, to manufacture a monolithic piezoelectric part with a high piezoelectric d constant wherein deterioration of insulation resistance can be suppressed.

Moreover, the B site component may also contain at least one or more components selected from Nb, Sb, Ta and W, and the B site component may also contain at least one or more components selected from Ni, Cr, Co and Mg.

Inclusion of quinquevalent Nb, Sb and Ta or sexivalent W as a donor ion, or suitable preparation of quinquevalent Nb, Sb and Ta, and/or sexivalent W, and bivalent Ni, Co and Mg, and/or tervalent Cr, so as to have a donor excess effect by which the average valence of the B site component is greater than quadrivalent, promotes formation of Pb pores compensating for oxygen pores, to manufacture a monolithic piezoelectric part with a high piezoelectric d constant wherein deterioration of insulation resistance can be suppressed, the same as described above.

The layered article fabrication step may comprise a ceramic green sheet fabrication step for forming the piezoelectric ceramic powdered raw material into a sheet form so as to fabricate a ceramic green sheet, a step for forming an electrode pattern on the ceramic green sheet with an electroconductive paste for internal electrodes, and a step for layering the ceramic green sheets upon which the electrode patterns have been formed so as to form a layered article.

Further, the electroconductive paste may contain Ag as a primary component in the method for manufacturing a monolithic piezoelectric part according to the present invention.

Even in the event that Ag, which is less expensive than Pd or the like, occupies the greater portion of the internal electrode material, the Pb pores compensate for the oxygen pores generated by dispersion of Ag, so deterioration of the piezoelectric d constant and the insulation resistance can be avoided.

The monolithic piezoelectric part according to the present invention may be manufactured by the above-described method.

According to the above structure, a highly-reliable monolithic piezoelectric part with a high piezoelectric d constant and excellent insulation resistance can be obtained.

DESCRIPTION OF THE PREFERRED EMBODIMENTS

Next, embodiments of the present invention will be described.

Figure 1:
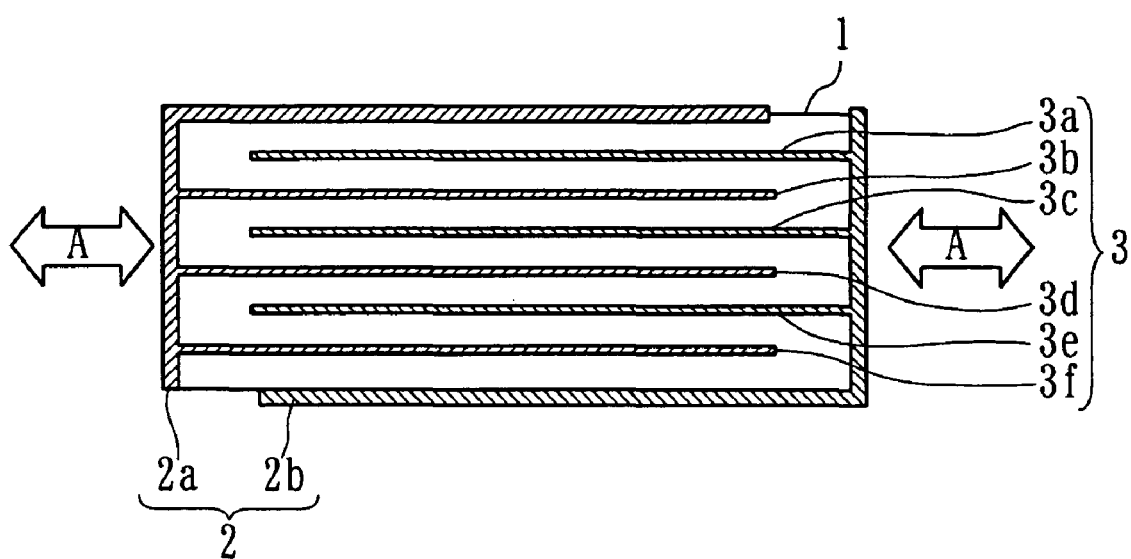
FIG. 1 is a cross-sectional diagram illustrating an embodiment (first embodiment) of a monolithic piezoelectric actuator serving as a monolithic piezoelectric part according to the present invention.

FIG. 1 is a cross-sectional diagram illustrating an embodiment (first embodiment) of a monolithic piezoelectric actuator serving as a monolithic piezoelectric part, manufactured by the manufacturing method according to the present invention.

The monolithic piezoelectric actuator is configured of a monolithic piezoelectric device, comprises a piezoelectric ceramic body 1 of which the primary component is lead zirconate titanate (Pb (Zi, Ti) $O_3$; PZT) as the perovskite compound oxide expressed by the general formula of $ABO_3$, external electrodes 2 (2a, 2b) made of Ag or the like and formed with an L-shaped cross-sectional shape over the top and bottom face to the sides of the piezoelectric ceramic body 1, and internal electrodes 3 (3a through 3f) embedded within the piezoelectric ceramic body 1 in a parallel-opposed array.

In the monolithic piezoelectric actuator, one end of the internal electrodes 3a, 3c, and 3e are electrically connected to one of the external electrodes, external electrode 2b, and one end of the internal electrodes 3b, 3d, and 3f are electrically connected to the other external electrode 2a. The direction of polarization of the monolithic piezoelectric actuator is perpendicular to the face of the internal electrodes 3, with each layer alternately polarized in the opposite direction. Then, by application of voltage between the external electrode 2a and 2b, the monolithic piezoelectric actuator is displaced in the longitudinal direction indicated by the arrow A due to piezoelectric transversal effects.

In the present embodiment, the internal electrodes 3 are formed of a mixture of Ad and Pg, prepared so that the ratio by weight of Ag to Pd is about 70/30 to 95/5.

Note that the content of Ag is preferably prepared to be about 80 wt % or greater from the perspective of increasing the inclusion amount of less expensive Ag to reduce costs, and the content of Ag is more preferably prepared to be about 85 wt % or greater.

Next, the method for manufacturing the monolithic piezoelectric actuator will be described.

First, as the ceramic raw material, a predetermined amount of $Pb_3O_4$, $ZrO_2$ and $TiO_2$, and, if necessary, $Nb_2O_5$, NiO, $Sb_2O_5$, $WO_3$, $Ta_2O_5$, $Cr_2O_3$, CoO and MgO, is measured, and the measured material is placed in a ball mill with a pulverizing medium therein such as a zirconia ball or the like, mixed, and pulverized for 16 to 64 hours. Subsequently, the mixed powder is subjected to calcination at 800° C. to 1000° C., thereby making a PZT ceramic powder raw material of which the primary component is represented by the chemical formula of $PB_{0.950-0.995}$ (Zr, Ti) $O_3$, i.e., a piezoelectric ceramic powdered raw material (hereafter, referred to simply as "ceramic powder raw material") wherein the molar quantity of Pb is reduced by about 0.5 mol % to 5.0 mol % from that of the stoichiometric composition.

Now, the reason that the molar quantity of Pb has been reduced by about 0.5 mol % to 5.0 mol % from that of the stoichiometric composition will be described below.

As described later, the piezoelectric ceramic body 1 is formed by sintering a layered article formed of multiple piezoelectric ceramic layers and internal electrode layers introduced between the piezoelectric ceramic layers, and in the event that the thickness of each of the piezoelectric ceramic layers is reduced or the percentage of Ag contained as the electrode material which is the primary component of the internal electrode layers is increased, the amount of dispersion of Ag into the piezoelectric ceramic body 1 increases, which promotes formation of oxygen pores, to bring about reduction in the piezoelectric d constant. Also when sintering is performed in a low-oxygen atmosphere to suppress dispersion of Ag into the piezoelectric ceramic body 1, formation of oxygen pores is promoted in the same way, and thereby reduction in the piezoelectric d constant is brought about.

However, Pb pores are formed in the event that the molar quantity of Pb is less than that of the stoichiometric composition, so the Pb pores compensate for the oxygen pore generation reaction, and suppress the decrease in the piezoelectric d constant and deterioration in insulation resistance.

In the event that the reduction of molar quantity of Pb is less than about 0.5 mol % from the stoichiometric composition, enough Pb pores to compensate for the oxygen pore generation reaction can not be formed, so the above effects are insufficient. On the other hand, the molar quantity of Pb contained is small, in the event that the reduction of molar quantity of Pb exceeds about 5.0 mol % from the stoichiometric composition, so the B site component may not be able to remain dissolved and may precipitate, or the density of the piezoelectric ceramic body 1 which is the sintered article may be lost, causing reduction in the piezoelectric d constant instead.

Accordingly, the molar quantity of Pb contained is reduced by 0.5 mol % to 5.0 mol % from that of the stoichiometric composition in the present embodiment.

Next, an organic binder and dispersant are added to the ceramic powder raw material thus generated, and a slurry is prepared with water as a solvent, and ceramic green sheets (hereafter, referred to simply as "ceramic sheets") are fabricated by the doctor blade method.

Note that the ceramic sheets, which are formed 18 to 130 µm thick, are preferably made to be as thin as possible in order to allow application of high field emission with a constant application voltage and to obtain great displacement, and about 64 µm or less (about 40 µm or less in the thickness after sintering) is preferable from the perspective of obtaining a small and/or high-performance monolithic piezoelectric actuator.

Next, screen printing is performed on the ceramic sheets with an electroconductive paste for internal electrodes prepared such that the ratio by weight of Ag as to Pd is about 70/30 to 95/5 (preferably about 80/20 or higher, and even more preferably about 85/15 or higher). A predetermined number of the ceramic sheets upon which screen printing has been performed are layered and then sandwiched between ceramic sheets upon which screen printing has not been preformed, and compressed, so as to form a layered article. That is, a layered article is fabricated with internal electrode layers disposed between multiple piezoelectric ceramic layers.

Next, the layered article is stored in an alumina case, subjected to degreasing, and then subjected to sintering processing at a sintering temperature of about 950° C. to 1080° C. for about 4 to 32 hours, with the oxygen concentration set to about 5 vol % or less but more than 0 vol %.

The reason that the oxygen concentration has been controlled so as to be about 5 vol % or lower is as follows.

The molar quantity of Pb contained is reduced by about 0.5 mol % to 5.0 mol % from that of the stoichiometric composition in the present embodiment, so that Pb pores formed thereby compensate for the oxygen pore generation reaction, and decrease in the piezoelectric d constant can be avoided even in a low-oxygen atmosphere. However, in the event that the oxygen concentration exceeds about 5 vol %, the piezoelectric d constant deteriorates and grain growth occurs which aggravates the density of the sintered article in the event that the layers are made thinner or in the event that the percentage of Ag contained in the internal electrode material is increased, which can lead to deterioration in insulation reliability and in strength.

Accordingly, the oxygen concentration is controlled at about 5 vol % or less but more than 0 vol %, and preferably at about 0.01 vol % or more but 1.0 vol % or less, for sintering.

Subsequently, the piezoelectric ceramic body 1 has electroconductive paste for external electrodes applied on predetermined positions on the surface thereof, and sintered, so as to form the external electrodes 3, whereby the monolithic piezoelectric actuator is formed.

Thus, a ceramic powder raw material wherein the primary component thereof is represented by the chemical formula of $PB_{0.950\sim0.995}$ (Zr, Ti) $O_3$ is generated by reducing the molar quantity of Pb contained by about 0.5 mol % to 5.0 mol % from that of the stoichiometric composition, and by forming the piezoelectric ceramic body 1 with this ceramic powder raw material, Pb pores can be formed. The Pb pores compensate for the dispersion of Ag and for the oxygen pores generated by sintering in the low-oxygen atmosphere, which suppresses decrease in the piezoelectric d constant and deterioration in insulation resistance, so a highly reliable monolithic piezoelectric actuator with excellent piezoelectric properties can be manufactured.

While decrease in the piezoelectric d constant and deterioration in insulation resistance can be suppressed by reducing the molar quantity of Pb contained by about 0.5 mol % to 5.0 mol % from that of the stoichiometric composition as described above, even more Pb pores can be formed by injecting a donor ion with a valence higher than that of Ti or Zr to the piezoelectric ceramic body 1, which suppresses decrease in the piezoelectric d constant and deterioration in insulation resistance even more effectively.

That is, with the B site component further containing ions other than Ti and Zr; Pb pores can be formed more effectively by injecting the donor ions to the piezoelectric ceramic body 1 so as to satisfy Expression 3, $$4.000 < \frac{\sum_{n=1}^{i} a_n b_n}{\sum_{n=1}^{i} b_n} < 4.100$$

wherein the valence of ions $M_n$ (n=1, 2, 3, . . . , i) included in the B site component are represented as $a_n$ (n=1, 2, 3, . . . , i), and the molar ratio of M, are represented as $b_n$ (n=1, 2, 3, . . . , i).

By making the average valence of the B site component greater than quadrivalent, equal to that of the stoichiometric composition, Pb pores can be formed more effectively, and the Pb pores compensate for the dispersion of Ag and for the oxygen pores generated by sintering in the low-oxygen atmosphere, which suppresses decrease in the piezoelectric d constant and deterioration in insulation resistance even more effectively.

More specifically, by using at least one or more selected from $Nb^{5+}$, $Sb^{5+}$, $Ta^{5+}$ and $W^{6+}$, which have a greater valence than $Ti^{4+}$ or $Zr^{4+}$, as donor ions, and injecting the donor ions into the piezoelectric ceramic body 1, part of the Zr for example is substituted with the donor ions to have a donor excess effect, which results in formation of Pb pores, and the Pb pores compensate for the dispersion of Ag and the oxygen pores generated by sintering in the low-oxygen atmosphere, and thereby decrease in the piezoelectric d constant and deterioration in insulation resistance can be suppressed even more effectively. The effects are even greater when $Nb^{5+}$ is included as a donor ion, in particular.

Also, a donor excess which is caused by injection into the piezoelectric ceramic body 1, along with the above donor ions, a suitable amount of one or more types selected from $Ni^{2+}$, $Co^{2+}$, $Mg^{2+}$ and $Cr^{3+}$, which have a valence lower than the above donor ions, is preferable, and particularly, use of $Nb^{5+}$ and $Ni^{2+}$ in combination can suppress decrease in the piezoelectric d constant and deterioration in insulation resistance effectively, so an extremely high piezoelectric d constant can be obtained.

Thus, making the average valence of the B site component greater than quadrivalent compared with the stoichiometric composition forms Pb pores effectively, and the Pb pores compensate for the dispersion of Ag and the oxygen pores generated by sintering in the low-oxygen atmosphere, whereby decrease in the piezoelectric d constant and deterioration in insulation resistance can be effectively suppressed.

Now, the reason that the average valence of the B site component has been set to about 4.100 or less in the above Expression is that the sinterability deteriorates when the average valence is about 4.100 or greater, and in the process of co-sintering with internal electrode materials containing a high percentage of Ag, insufficient sintering or deformation of the sintered article may occur at sintering temperatures where normal co-sintering can be performed.

The average valence of the B site component can also be controlled by using a predetermined molar amount of the ions in the form of metal oxides, along with the above-described ceramic raw material.

That is to say, a predetermined molar quantity of one or more selected from $Pb_3O_4$, $ZrO_2$, and $TiO_2$, $Nb_2O_5$, $Sb_2O_5$, $Ta_2O_5$, $WO_3$ (preferably including $Nb_2O_5$) and, if necessary, one or more selected from NiO, CoO, MgO, and $Cr_2O_3$, (preferably including NiO) is used so as to set the average valence of the B site component to a predetermined value of quadrivalent or greater (but less than about 4.100), and then by the same method and procedures as described above a monolithic piezoelectric actuator wherein donor excess has been effected can be readily manufactured.

Note that the present invention is not restricted to the above-described embodiment. While the above embodiment has been described with reference to an example of a monolithic piezoelectric actuator as the monolithic piezoelectric part, it is needless to say that this may be applied in the same manner to other monolithic piezoelectric parts such as piezoelectric audio emitters, piezoelectric sensors, and so forth, which require a high piezoelectric d constant, neither the layered structure, device shape, direction of displacement and force, polarization direction, and voltage application direction are restricted to the above embodiment.

Figure 2:
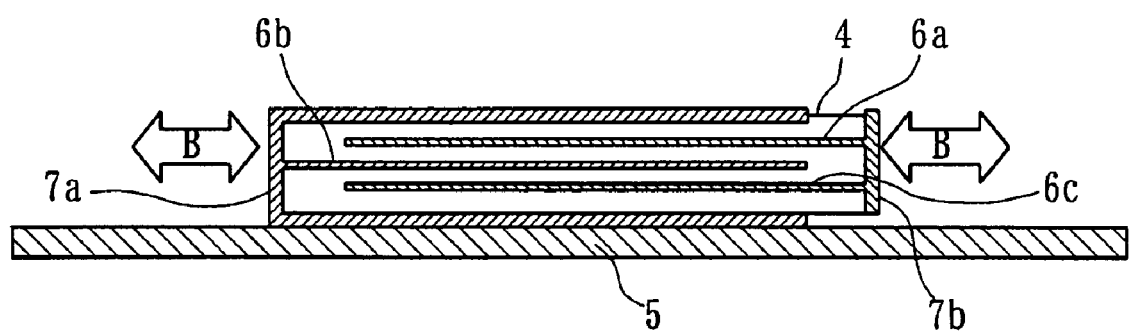
FIG. 2 is a cross-sectional diagram illustrating a monolithic piezoelectric audio emitter as a second embodiment of the monolithic piezoelectric part.

FIG. 2 is a cross-sectional diagram illustrating a monolithic piezoelectric audio emitter as a second embodiment of the monolithic piezoelectric part.

The monolithic piezoelectric audio emitter has a monolithic piezoelectric device 4 and a diaphragm 5 bonded one to another. Also, the monolithic piezoelectric device 4 has external electrodes 7a and 7b formed on the surface of the piezoelectric ceramic body 6 of which PZT is the primary component, and further, internal electrodes 6a through 6c are embedded within the piezoelectric ceramic body 6 in a parallel-opposed array.

The monolithic piezoelectric device 4 has one end of the internal electrodes 6a and 6c electrically connected to one of the external electrodes, external electrode 7b, and one end of the internal electrode 6b is electrically connected to the other external electrode 7a. By application of voltage between the external electrode 7a and 7b, the monolithic piezoelectric device 4 is displaced in the longitudinal direction indicated by the arrow B due to piezoelectric transversal effects, and this displacement causes excitation of flexion vibrations at the diaphragm 5, to emit sound.

With this monolithic piezoelectric audio emitter as well, manufacturing the piezoelectric ceramic body 6 by the above-described manufacturing method allows decrease in the piezoelectric d constant and deterioration in insulation resistance to be effectively suppressed, so a monolithic piezoelectric audio emitter with excellent reliability is manufactured.

Figure 3:
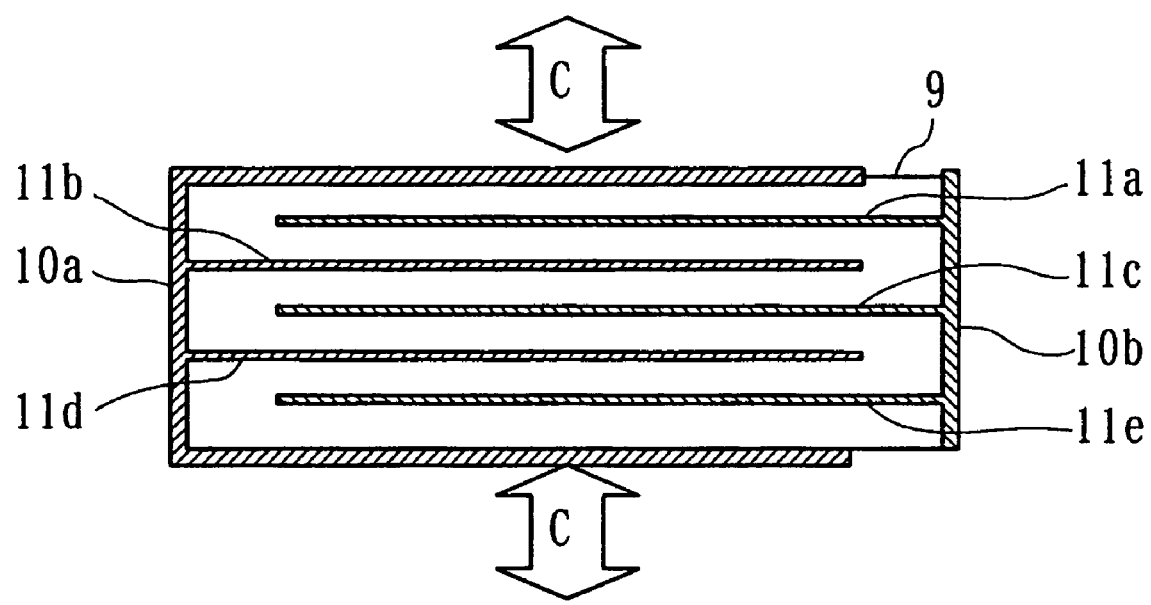
FIG. 3 is a cross-sectional diagram illustrating a monolithic piezoelectric sensor as a third embodiment of the monolithic piezoelectric part.

FIG. 3 is a cross-sectional diagram illustrating a monolithic piezoelectric sensor as a third embodiment of the monolithic piezoelectric part.

As in the first embodiment, the monolithic piezoelectric sensor is made up of the monolithic piezoelectric device and has external electrodes 10a and 10b formed on the surface of a piezoelectric ceramic body 9 of which PZT is the primary component, and further, internal electrodes 11a through 11e are embedded within the piezoelectric ceramic body 9 in a parallel-opposed array.

The monolithic piezoelectric sensor has one end of the internal electrodes 11a, 11c, and 11e electrically connected to one of the external electrodes, external electrode 10b, and one end of the internal electrodes 11b and 11d electrically connected to the other external electrode 10a. Application of force in the direction indicated by the arrow C generates a charge between the external electrode 10a and the external electrode 10b due to piezoelectric longitudinal effects, and force is detected by this charge.

With this monolithic piezoelectric sensor as well, manufacturing the piezoelectric ceramic body 9 by the above-described manufacturing method allows decrease in the piezoelectric d constant and deterioration in insulation resistance to be effectively suppressed, so a monolithic piezoelectric sensor with excellent reliability can be manufactured.

Note that while the present embodiment uses the sheet method suitable for mass-production to form the layered article, the process for forming the layered article is not restricted to the sheet method. It is needless to say that similar effects can be obtained by using other layered article formation processes, such as print-laminating process or the like, for example.

EMBODIMENTS

Next, examples of the present invention will be described in detail.

First Embodiment

The inventors prepared test pieces of monolithic piezoelectric parts with different composition ratios of ceramic powder raw materials (Examples 1 through 18 and Comparative examples 1 through 9), and evaluated the amount of Ag dispersion, piezoelectric $d_{31}$ constant, and insulation resistance.

EXAMPLES 1 THROUGH 3

First, $Pb_3O_4$, $TiO_2$ and $ZrO_2$ were prepared as ceramic raw materials, and $Pb_3O_4$ was measured such that the molar quantity of Pb contained making up the A site would be less than that of the stoichiometric composition by 0.5 mol % to 5.0 mol %, while $TiO_2$ and $ZrO_2$ were measured such that the molar quantity of Ti and Zr in the B site would be 44.5 to 45.5 mol % and 54.5 to 55.5 mol %, respectively. Next, the measured materials were placed in a ball mill with a zirconia ball therein as a pulverizing medium, mixed and pulverized for 16 to 64 hours, and then the obtained mixed powder was subjected to calcination at 800° C. to 1000° C., to make a ceramic powder raw material.

Next, an organic binder and dispersant was added to the ceramic powder raw material, a slurry was prepared with water as a solvent, and ceramic sheets 40 μm in thickness were fabricated by the doctor blade method.

Next, screen printing was performed on the ceramic sheets with an electroconductive paste for internal electrodes prepared such that the ratio by weight of Ag to Pd is 85/15, the predetermined number of the ceramic sheets upon which screen printing has been performed were layered and then sandwiched between ceramic sheets upon which screen printing has not been preformed, and compressed, so as to form a layered article with 4 to 20 layered sheets. Next, the layered article was stored in an alumina case, subjected to degreasing, and then subjected to sintering processing at a sintering temperature of 1020° C. for 4 to 32 hours, with the oxygen concentration set to 0.2 vol %, so a ceramic sintered article 0.1 to 0.5 mm in total thickness was fabricated.

Next, the ceramic sintered article was diced into 3 mm vertically and 13 mm horizontally, and external electrodes were formed with the electroconductive paste for external electrodes, and then polarization processing was performed for 5 to 30 minutes in an insulating oil at 40 to 80° C. with an electric field of 2 to 3 kV applied, to fabricate the test pieces for the Examples 1 through 3.

EXAMPLES 4 THROUGH 7

First, $Pb_3O_4$, $TiO_2$, $ZrO_2$ and $Nb_2O_5$ were prepared as ceramic raw materials, and $Pb_3O_4$ was measured such that the molar quantity of Pb would be less than that of the stoichiometric composition by 0.5 mol % to 5.0 mol %, and $TiO_2$, $ZrO_2$ and $Nb_2O_5$ were measured such that the molar quantity of Ti, Zr, and Nb contained at the B site would be 44.0 to 45.0 mol %, 54.0 to 55.0 mol %, and 1.0 mol %, respectively, and then they were subjected to wet mixing pulverization, and to calcination, to make a ceramic powder raw material with an average valence of the B site at 4.010.

Subsequently, test pieces for Examples 4 through 7 were fabricated by the same method and procedures as for the above Examples 1 through 3.

EXAMPLES 8 THROUGH 14

$Pb_3O_4$, $TiO_2$, $ZrO_2$, $Nb_2O_5$ and NiO were prepared as ceramic raw materials, and $Pb_3O_4$ was measured such that the molar quantity of Pb contained would be less than that of the stoichiometric composition by 0.5 mol % to 5.0 mol %, and $TiO_2$, $ZrO_2$ $Nb_2O_5$, and NiO were measured such that the molar quantity of Ti, Zr, Nb, and Ni contained at the B site would be 38.0 to 39.0 mol %, 35.5 to 36.5 mol %, 17.0 to 17.3 mol %, and 8.2 to 8.5 mol %, respectively, then they were subjected to wet mixing pulverization, and to calcination, to make a ceramic powder raw material with an average valence of the B site between 4.000 and 4.009.

Subsequently, ceramic sheets were fabricated with the same method and procedures as for the above Examples 1 through 3, and screen printing was performed on the ceramic sheets with an electroconductive paste for internal electrodes prepared such that the ratio by weight of Ag to Pd was 90/10, to form a layered article. Next, the layered article was stored in an alumina case, subjected to degreasing, and then to sintering processing at a sintering temperature of 980° C. for 4 to 32 hours, with the oxygen concentration set to 0.2 vol %, thereby a ceramic sintered article was fabricated.

Subsequently, test pieces for Examples 8 through 14 were fabricated by the same method and procedures as for the above Examples 1 through 3.

EXAMPLES 15 THROUGH 18

$Pb_3O_4$, $TiO_2$, $ZrO_2$, $Nb_2O_5$, NiO, $Sb_2O_5$, $Ta_2O_5$, $WO_3$, $Cr_2O_3$, CoO and MgO were prepared as ceramic raw material, $Pb_3O_4$ was measured such that the molar quantity of Pb contained would be less than that of the stoichiometric composition by 0.5 to 1.5 mol %, and $TiO_2$, $ZrO_2$, $Nb_2O_5$, NiO, $Sb_2O_5$, $Ta_2O_5$, $WO_3$, $Cr_2O_3$, CoO and MgO were measured such that the molar quantity of Ti, Zr, Nb, Ni, Sb, Ta, W, Cr, Co, and Mg contained at the B site would be 34.0 to 39.0 mol %, 16.0 to 35.5 mol %, 13.0 to 35.0 mol %, 6.0 to 15.0 mol %, 0 to 3.3 mol %, 0 to 0.5 mol %, 0 to 0.8 mol %, 0 to 2.2 mol %, 0 to 0.6 mol %, and 0 to 0.6 mol %, respectively. They were subjected to wet mixing pulverization, and to calcination, to make a ceramic powder raw material with an average valence of the B site between 4.031 and 4.050.

Subsequently, ceramic sheets were fabricated by the same method and procedures as in the above Examples 1 through 3, and screen printing was performed on the ceramic sheets with an electroconductive paste for internal electrodes prepared such that the ratio by weight of Ag to Pd was 80/20 to 85/15, to form a layered article. Next, the layered article was stored in an alumina case, subjected to degreasing, and then to sintering processing at a sintering temperature of 1020 to 1040° C. for 4 to 32 hours, with the oxygen concentration set to 0.2 vol %, to fabricate a ceramic sintered article.

Subsequently, test pieces for Examples 15 through 18 were fabricated by the same method and procedures as in the above Examples 1 through 3.

COMPARATIVE EXAMPLES 1 AND 2

Test pieces for Comparative examples 1 and 2 were fabricated by the same method and procedures as in Examples 1 through 3, except that the molar quantity of Pb contained was the same as that of the stoichiometric composition or less than that of the stoichiometric composition by 8 mol %.

COMPARATIVE EXAMPLES 3 AND 4

Test pieces for the Comparative examples 3 and 4 were fabricated with the same method and procedures as for the Examples 4 through 7, except that the molar quantity of Pb contained was the same as that of the stoichiometric composition or less than that of the stoichiometric composition by 8 mol %.

COMPARATIVE EXAMPLES 5 THROUGH 8

Test pieces for Comparative examples 5 through 8 were fabricated by the same method and procedures as in Examples 8 through 14, except that the molar quantity of Pb contained was the same as that of the stoichiometric composition or less than that of the stoichiometric composition by 8 mol %.

COMPARATIVE EXAMPLE 9

A test piece for Comparative example 9 was fabricated by the same method and procedures as in Examples 15 through 18, except that the molar quantity of Pb contained was that of the stoichiometric composition, and the amount of Nb and Ni contained was 36.7 mol % and 13.3 mol % respectively, and the average valence of the B site was set to 4.101.

Next, the inventors measured the amount of Ag dispersed into the ceramic body, the piezoelectric $d_{31}$ constant, and the resistivity $\log\rho$ for each test piece.

Measurement of the dispersion amount of Ag was performed by quantitative analysis by an X-ray micro-analyzer (Wave Dispersive X-ray; hereafter referred to as "WDX"). Measurement of the amount of Ag contained in the analysis region was performed by an analytical curve created by use of a sample where the amount of Ag contained is known.

The piezoelectric $d_{31}$ constant was measured by the resonance-antiresonance method, with an impedance analyzer (Model HP4194, manufactured by Hewlett-Packard Company).

The resistivity $\log\rho$ was calculated by measurement of the insulation resistance by applying a DC electric field of 100 to 300 V/mm for 30 seconds to 1 minute at a temperature of 25° C., with an Ultra-High Resistance/Micro Current Meter (Model R8240A, manufactured by Advantest Corporation).

Table 1 illustrates the component compositions of the Examples 1 through 18 and Comparative examples 1 through 9, and Table 2 illustrates the sintering temperature, oxygen concentration in the atmosphere at the time of sintering, the ratio by weight of Ag to Pd which are the internal electrode material, the thickness of the ceramic sheets, the thickness of each unit ceramic layer after sintering, and the results of the above measurement.

TABLE 1

| | A site component (mol %) | B site Component (mol %) | | | | | | | | | | Average valence |
|---|---|---|---|---|---|---|---|---|---|---|---|---|
| | Pb | Ti | Zr | Nb | Ni | Sb | Ta | W | Cr | Co | Mg | |
| Examples | | | | | | | | | | | | |
| 1 | 99.5 | 45.5 | 54.5 | — | — | — | — | — | — | — | — | 4.000 |
| 2 | 98.0 | 45.5 | 54.5 | — | — | — | — | — | — | — | — | 4.000 |
| 3 | 95.0 | 44.5 | 55.5 | — | — | — | — | — | — | — | — | 4.000 |
| 4 | 99.5 | 45.0 | 54.0 | 1.0 | — | — | — | — | — | — | — | 4.010 |
| 5 | 98.0 | 45.0 | 54.0 | 1.0 | — | — | — | — | — | — | — | 4.010 |
| 6 | 96.5 | 44.5 | 54.5 | 1.0 | — | — | — | — | — | — | — | 4.010 |
| 7 | 95.0 | 44.0 | 55.0 | 1.0 | — | — | — | — | — | — | — | 4.010 |
| 8 | 99.5 | 39.0 | 35.5 | 17.0 | 8.5 | — | — | — | — | — | — | 4.000 |
| 9 | 98.0 | 38.5 | 36.0 | 17.0 | 8.5 | — | — | — | — | — | — | 4.000 |
| 10 | 95.0 | 38.0 | 36.5 | 17.0 | 8.5 | — | — | — | — | — | — | 4.000 |
| 11 | 99.5 | 39.0 | 35.5 | 17.3 | 8.2 | — | — | — | — | — | — | 4.009 |
| 12 | 98.0 | 39.0 | 35.5 | 17.3 | 8.2 | — | — | — | — | — | — | 4.009 |
| 13 | 96.5 | 38.5 | 36.0 | 17.2 | 8.3 | — | — | — | — | — | — | 4.006 |
| 14 | 95.0 | 38.0 | 36.5 | 17.2 | 8.3 | — | — | — | — | — | — | 4.006 |
| 15 | 98.5 | 39.0 | 35.5 | 14.0 | 6.0 | 3.3 | — | — | 2.2 | — | — | 4.031 |
| 16 | 98.5 | 39.0 | 35.5 | 13.0 | 6.0 | 3.0 | 0.5 | 0.8 | 1.0 | 0.6 | 0.6 | 4.031 |
| 17 | 99.0 | 37.0 | 23.0 | 28.0 | 12.0 | — | — | — | — | — | — | 4.040 |
| 18 | 99.5 | 34.0 | 16.0 | 35.0 | 15.0 | — | — | — | — | — | — | 4.050 |
| Comparative Examples | | | | | | | | | | | | |
| 1 | 100.0 | 45.5 | 54.5 | — | — | — | — | — | — | — | — | 4.000 |
| 2 | 92.0 | 44.5 | 55.5 | — | — | — | — | — | — | — | — | 4.000 |
| 3 | 100.0 | 45.0 | 54.0 | 1.0 | — | — | — | — | — | — | — | 4.010 |
| 4 | 92.0 | 44.0 | 55.0 | 1.0 | — | — | — | — | — | — | — | 4.010 |
| 5 | 100.0 | 39.0 | 35.5 | 17.0 | 8.5 | — | — | — | — | — | — | 4.000 |
| 6 | 92.0 | 38.0 | 36.5 | 17.0 | 8.5 | — | — | — | — | — | — | 4.000 |
| 7 | 100.0 | 39.0 | 35.5 | 17.3 | 8.2 | — | — | — | — | — | — | 4.009 |
| 8 | 92.0 | 38.0 | 36.5 | 17.2 | 8.3 | — | — | — | — | — | — | 4.006 |
| 9 | 100.0 | 34.0 | 16.0 | 36.7 | 13.3 | — | — | — | — | — | — | 4.101 |

TABLE 2

| | Sintering Temperature (° C.) | Oxygen Concentration (vol %) | Ag/Pd (Weight ratio) | Ceramic sheet thickness (μm) | Thickness of unit ceramic layer (μm) | Ag dispersion (wt %) | $|d_{31}|$ (pC/N) | Resistivity $\log\rho$ ($\Omega \cdot cm$) |
|---|---|---|---|---|---|---|---|---|
| Examples | | | | | | | | |
| 1 | 1020 | 0.2 | 85/15 | 40 | 25 | 0.15 | 138 | 11.0 |
| 2 | 1020 | 0.2 | 85/15 | 40 | 25 | 0.22 | 145 | 11.0 |
| 3 | 1020 | 0.2 | 85/15 | 40 | 25 | 0.27 | 155 | 11.2 |
| 4 | 1020 | 0.2 | 85/15 | 40 | 25 | 0.20 | 168 | 11.6 |
| 5 | 1020 | 0.2 | 85/15 | 40 | 25 | 0.30 | 176 | 11.9 |
| 6 | 1020 | 0.2 | 85/15 | 40 | 25 | 0.35 | 174 | 11.8 |
| 7 | 1020 | 0.2 | 85/15 | 40 | 25 | 0.38 | 157 | 11.6 |
| 8 | 980 | 0.2 | 90/10 | 40 | 25 | 0.13 | 179 | 11.2 |
| 9 | 980 | 0.2 | 90/10 | 40 | 25 | 0.20 | 189 | 11.4 |
| 10 | 980 | 0.2 | 90/10 | 40 | 25 | 0.24 | 173 | 11.3 |
| 11 | 980 | 0.2 | 90/10 | 40 | 25 | 0.19 | 211 | 11.6 |
| 12 | 980 | 0.2 | 90/10 | 40 | 25 | 0.22 | 223 | 11.7 |
| 13 | 980 | 0.2 | 90/10 | 40 | 25 | 0.28 | 215 | 11.7 |
| 14 | 980 | 0.2 | 90/10 | 40 | 25 | 0.33 | 192 | 11.6 |
| 15 | 1020 | 0.2 | 85/15 | 40 | 25 | 0.24 | 214 | 11.6 |
| 16 | 1020 | 0.2 | 85/15 | 40 | 25 | 0.23 | 205 | 11.5 |
| 17 | 1040 | 0.2 | 80/20 | 40 | 25 | 0.34 | 242 | 11.4 |
| 18 | 1040 | 0.2 | 80/20 | 40 | 25 | 0.37 | 254 | 11.0 |
| Comparative Examples | | | | | | | | |
| 1 | 1020 | 0.2 | 85/15 | 40 | 25 | 0.11 | 96 | 10.2 |
| 2 | 1020 | 0.2 | 85/15 | 40 | 25 | 0.35 | 78 | 10.5 |
| 3 | 1020 | 0.2 | 85/15 | 40 | 25 | 0.15 | 115 | 10.9 |
| 4 | 1020 | 0.2 | 85/15 | 40 | 25 | 0.41 | 108 | 10.8 |
| 5 | 980 | 0.2 | 90/10 | 40 | 25 | 0.09 | 102 | 10.7 |
| 6 | 980 | 0.2 | 90/10 | 40 | 25 | 0.31 | 114 | 11.0 |

TABLE 2-continued

| | Sintering Temperature (° C.) | Oxygen Concentration (vol %) | Ag/Pd (Weight ratio) | Ceramic sheet thickness (μm) | Thickness of unit ceramic layer (μm) | Ag dispersion (wt %) | $|d_{31}|$ (pC/N) | Resistivity $\log\rho$ ($\Omega \cdot$ cm) |
|---|---|---|---|---|---|---|---|---|
| 7 | 980 | 0.2 | 90/10 | 40 | 25 | 0.12 | 132 | 10.9 |
| 8 | 980 | 0.2 | 90/10 | 40 | 25 | 0.39 | 120 | 11.3 |
| 9 | 1040 | 0.2 | 80/20 | 40 | Evaluation impossible due to deformation | | | |

For the thickness of each unit ceramic layer, the average value was calculated through observation of the cross-sectional surface of the ceramic sintered article after sintering with an optical microscope.

As can be clearly understood from Tables 1 and 2, the molar quantity of Pb contained is the same as that of the stoichiometric composition (100 mol %) in Comparative examples 1, 3, 5 and 7, so although oxygen pores are formed, no Pb pores for compensating for the oxygen pores are formed, and accordingly the piezoelectric $d_{31}$ constant is low at 96 to 132 pC/N, and the resistivity $\log\rho$ is less than 11.0 $\Omega$·cm, with deterioration in insulation resistance observed.

Also, the molar quantity of Pb contained has been excessively reduced by 8 mol % from that of the stoichiometric composition in Comparative examples 2, 4, 6 and 8, and the piezoelectric $d_{31}$ constant is low at 78 to 120 pC/N. It is thought that Ti, Zr, Nb, and Ni composing the B site component was not able to remain dissolved and precipitated due to an excessive reduction in molar quantity of Pb, or the density of the sintered article was lost due to the reduction in the amount of Pb, which caused reduction in the piezoelectric $d_{31}$ constant.

In Comparative example 9, the average valence of the B site was 4.101, meaning a donor excess, and/or the molar quantity of Pb contained is the same as that of the stoichiometric composition (100 mol %), so deformation after sintering was serious and sintering was insufficient to the extent that its evaluation was impossible.

In Examples 1 through 18, on the other hand, the molar quantity of Pb contained has been reduced by 0.5 mol % to 5.0 mol % from that of the stoichiometric composition, so the piezoelectric $d_{31}$ constant was high at 138 to 254 pC/N, and the resistivity $\log\rho$ also showed excellent insulation resistance at 11.0 to 11.7 $\Omega$·cm.

As can be clearly understood from the comparisons between Examples 1 through 3 and Examples 4 through 7, in Examples 4 through 7 where Nb was added, in spite of some increases in dispersion of Ag, the average valence of the B site was 4.010, meaning a donor excess, so the number of Pb pores increases according to the reduction in the molar quantity of Pb contained, and thereby the oxygen pores generated by sintering in the low-oxygen atmosphere and the dispersion of Ag are readily compensated for by the Pb pores. Accordingly, a high piezoelectric $d_{31}$ constant as well as excellent insulation resistance can be obtained even in cases wherein a relatively high amount of dispersion of Ag is expected.

As can also be clearly understood from the comparisons between Examples 1 through 3 and Examples 8 through 10, in the event that the molar quantity of Pb contained is the same and the average valence of the B site is 4.000 which is same as the stoichiometric composition, the case where Nb and Ni are included proved to obtain a higher piezoelectric $d_{31}$ constant and excellent insulation resistance.

As can be clearly understood from the comparisons between Examples 8 through 10 and Examples 11, 12, and 14, in the event that the molar quantity of Pb contained is the same, the case where Nb and Ni were included and also the average valence of the B site was increased beyond 4.000 which is the same as the stoichiometric composition has a greater effect of Nb and Ni, which was confirmed by improvement in the piezoelectric $d_{31}$ constant, in spite of some increases in the amount of dispersion of Ag.

It was further confirmed from Examples 15 and 16 that in cases of including Sb, Ta and W as donor ions besides Nb, or in case of including Cr, Co, and Mg as acceptor ions besides Ni, the same effects as above could be obtained. Further, it was confirmed from Examples 17 and 18 that the same effects could be obtained in cases of further increasing the inclusion amount of Nb and Ni.

Second Embodiment

The inventors fabricated test pieces of the monolithic piezoelectric part in the same way as with the first embodiment using the ceramic powder raw material of the same composition as with Example 12 and Comparative example 5, changing the oxygen concentration of the sintering atmosphere in various ways.

EXAMPLES 21 THROUGH 25

Ceramic sheets were fabricated with the same method and procedures as in the first embodiment with the ceramic powder raw material of the same composition as in Example 12, and screen printing was performed on the ceramic sheets with an electroconductive paste for internal electrodes prepared such that the ratio by weight of Ag to Pd was 90/10, and then a layered article was formed. Next, the layered article was stored in an alumina case, subjected to degreasing, and then subjected to sintering processing at a sintering temperature of 980° C. for 4 to 32 hours, with the oxygen concentration set to 0.01 to 5.0 vol %, and thereby a ceramic sintered article was fabricated.

Subsequently, test pieces for Examples 21 through 25 were fabricated by the same method and procedures as in the first embodiment.

COMPARATIVE EXAMPLES 21 AND 22

Test pieces for Comparative examples 21 and 22 were fabricated with the ceramic powder raw material of the same composition as in Examples 21 through 25, by sintering with the oxygen concentration at 10.0 vol % and 21.0 vol %, respectively.

COMPARATIVE EXAMPLES 23 THROUGH 28

Ceramic sheets were fabricated by the same method and procedures as in the first embodiment with the ceramic powder raw material of the same composition as in Comparative example 5, and screen printing was performed on the ceramic sheets with an electroconductive paste for internal electrodes prepared so that the ratio by weight of Ag to Pd was 90/10, to form a layered article. Next, the layered article was stored in an alumina case, subjected to degreasing, and then test pieces for Comparative examples 23 through 28 were fabricated by the same method and procedures as in Examples 21 through 24, with the oxygen concentration set to 0.05 to 21.0 vol %.

Next, the inventors measured, as in the first embodiment, the amount of Ag dispersion into the ceramic body, the piezoelectric $d_{31}$ constant, and the resistivity log$\rho$, for each test piece. Further, the average grain diameter was calculated by the intercept method through observation of the cross-sectional surface of the ceramic sintered article after sintering with a scanning electron microscope.

Table 3 illustrates the sintering temperature, oxygen concentration in the atmosphere at the time of sintering, the ratio by weight Ag/Pd of the internal electrodes, the thickness of the ceramic sheets, the thickness of each unit ceramic layer after sintering, and the results of the above measurement, in Examples 21 through 25 and Comparative examples 21 through 28.

On the other hand, it was confirmed that in Examples 21 through 25, where the molar quantity of Pb contained is reduced by 2 mol %, and moreover sintering is performed in a low-oxygen atmosphere of 0.01 to 5.0 vol %, a good piezoelectric $d_{31}$ constant can be obtained, and also, decrease in the insulation resistance can be suppressed. Particularly, it was confirmed that the piezoelectric $d_{31}$ constant and insulation resistance were especially excellent in case of sintering in a low-oxygen atmosphere of less than 1.0 vol %.

Third Embodiment

The inventors fabricated test pieces of the monolithic piezoelectric part in the same way as in the first embodiment with the ceramic powder raw material of the same composition as in Example 12 and Comparative example 5, by changing the Ag/Pd weight ratio of the internal electrodes in various ways.

EXAMPLES 31 THROUGH 35

Ceramic sheets with a thickness of 32 μm were fabricated, as in the second embodiment, with the ceramic powder raw

TABLE 3

| | Sintering temperature (° C.) | Oxygen concentration (vol %) | Ag/Pd (Weight ratio) | Ceramic sheet thickness (μm) | Thickness of unit ceramic layer (μm) | Ag dispersion (wt %) | $|d_{31}|$ (pC/N) | Resistivity log$\rho$ ($\Omega \cdot$ cm) | Grain diameter (μm) |
|---|---|---|---|---|---|---|---|---|---|
| Examples | | | | | | | | | |
| 21 | 980 | 0.01 | 90/10 | 40 | 25 | 0.12 | 216 | 11.6 | 1.8 |
| 22 | 980 | 0.05 | 90/10 | 40 | 25 | 0.13 | 218 | 11.6 | 1.9 |
| 23 | 980 | 0.5 | 90/10 | 40 | 25 | 0.25 | 221 | 11.7 | 2.3 |
| 24 | 980 | 0.9 | 90/10 | 40 | 25 | 0.28 | 223 | 11.6 | 2.7 |
| 25 | 980 | 5.0 | 90/10 | 40 | 25 | 0.35 | 209 | 11.4 | 3.4 |
| Comparative Examples | | | | | | | | | |
| 21 | 980 | 10.0 | 90/10 | 40 | 25 | 0.44 | 192 | 10.9 | 4.8 |
| 22 | 980 | 21.0 | 90/10 | 40 | 25 | 0.53 | 188 | 10.6 | 6.3 |
| 23 | 980 | 0.05 | 90/10 | 40 | 25 | 0.09 | 90 | 10.6 | 1.5 |
| 24 | 980 | 0.5 | 90/10 | 40 | 25 | 0.18 | 104 | 10.8 | 1.7 |
| 25 | 980 | 0.9 | 90/10 | 40 | 25 | 0.23 | 104 | 10.8 | 2.2 |
| 26 | 980 | 5.0 | 90/10 | 40 | 25 | 0.25 | 115 | 11.0 | 2.8 |
| 27 | 980 | 10.0 | 90/10 | 40 | 25 | 0.36 | 132 | 10.9 | 4.3 |
| 28 | 980 | 21.0 | 90/10 | 40 | 25 | 0.44 | 151 | 10.8 | 5.2 |

As can be clearly understood from Table 3, the molar quantity of Pb contained is reduced by 2 mol % in Comparative examples 21 and 22, so the piezoelectric $d_{31}$ constant is relatively good, but the oxygen concentration is high at 10.0 vol % and 21.0 vol %, respectively, so the piezoelectric $d_{31}$ constant is lower in comparison with Examples 21 through 25. Also, grain growth was observed, and decrease in insulation resistance was confirmed by the result that the resistivity log$\rho$ was less than 11.0 $\Omega \cdot$cm,.

In Comparative examples 23 through 26, the molar quantity of Pb contained is the same as that of the stoichiometric composition, and moreover, sintering is performed within a low-oxygen atmosphere, so generation of oxygen pores is promoted, and decrease in piezoelectric $d_{31}$ constant was observed.

Further, the oxygen concentration is high at 10.0 vol % and 21.0 vol %, respectively, in Comparative examples 27 and 28, so grain growth was observed as in Comparative examples 21 and 22, and decrease in insulation resistance was confirmed by the result that the resistivity log$\rho$ was less than 11.0 $\Omega \cdot$cm.

material of the same composition as in Example 12, and screen printing was performed on the ceramic sheets with an electroconductive paste for internal electrodes prepared so that the ratio by weight of Ag to Pd was 95/5 to 70/30, to form a layered article. Next, the layered article was stored in an alumina case, subjected to degreasing, and then to sintering processing at a sintering temperature of 950 to 1080° C. for 4 to 32 hours, with the oxygen concentration set to 0.2 vol %, and thereby a ceramic sintered article with a unit ceramic layer thickness following sintering of 20 μm was fabricated.

Subsequently, test pieces for Examples 31 through 35 were fabricated in the same way as in the first embodiment.

COMPARATIVE EXAMPLES 31 THROUGH 35

Ceramic sheets with a thickness of 32 μm were fabricated by the same method and procedures as in the second embodiment with the ceramic powder raw material of the same composition as in Comparative example 5, and screen printing was performed on the ceramic sheets with an electroconductive paste for internal electrodes prepared so that the ratio by weight Ag to Pd was 95/5 to 70/30, to form a layered article. Next, the layered article was stored in an alumina case, subjected to degreasing, and then to sintering processing at a sintering temperature of 950 to 1080° C. for 4 to 32 hours, with the oxygen concentration set to 21.0 vol %, and thereby a ceramic sintered article was fabricated.

Subsequently, test pieces for Comparative Examples 31 through 35 were fabricated in the same way as in the first embodiment.

Next, as in the second embodiment, the inventors measured the amount of Ag dispersion into the ceramic body, the piezoelectric $d_{31}$ constant, the resistivity log$\sigma$, and the grain diameter after sintering.

Table 4 illustrates the sintering temperature, oxygen concentration in the atmosphere at the time of sintering, the ratio by weight of Ag to Pd, the thickness of the ceramic sheets, the thickness of each unit ceramic layer after sintering, and the results of the above measurement, in Examples 31 through 35 and Comparative examples 31 through 35.

tance was also improved markedly. This shows that the Pb pores generated by reduction in the molar quantity of Pb contained and a donor excess compensate for the oxygen pores generated by an increase in dispersion of Ag and sintering in a low-oxygen atmosphere, so the piezoelectric $d_{31}$ constant and the insulation resistance can be markedly improved even in the event that the percentage of Ag contained in the internal electrodes is high.

In addition, it was further confirmed that the grain diameter in Examples 31 through 35 was 1.8 to 3.6 μm, which was finer than the grain diameter in Comparative examples 31 through 35.

Fourth Embodiment

The inventors fabricated test pieces of the monolithic piezoelectric part in the same way as in the first embodiment with the ceramic powder raw material of the same composi-

TABLE 4

| | Sintering temperature (° C.) | Oxygen concentration (vol %) | Ag/Pd (Weight ratio) | Thickness of ceramic sheets (μm) | Thickness of unit ceramic layer (μm) | Ag dispersion (wt %) | $|d_{31}|$ (pC/N) | Resistivity log$\rho$ (Ω·cm) | Grain diameter (μm) |
|---|---|---|---|---|---|---|---|---|---|
| Examples | | | | | | | | | |
| 31 | 950 | 0.2 | 95/5 | 32 | 20 | 0.31 | 217 | 11.5 | 1.8 |
| 32 | 980 | 0.2 | 90/10 | 32 | 20 | 0.23 | 225 | 11.7 | 2.4 |
| 33 | 1020 | 0.2 | 85/15 | 32 | 20 | 0.21 | 229 | 11.6 | 2.9 |
| 34 | 1040 | 0.2 | 80/20 | 32 | 20 | 0.19 | 232 | 11.7 | 3.3 |
| 35 | 1080 | 0.2 | 70/30 | 32 | 20 | 0.12 | 240 | 11.7 | 3.6 |
| Comparative Examples | | | | | | | | | |
| 31 | 950 | 21.0 | 95/5 | 32 | 20 | 0.54 | 102 | 9.7 | 6.5 |
| 32 | 980 | 21.0 | 90/10 | 32 | 20 | 0.45 | 134 | 10.3 | 5.8 |
| 33 | 1020 | 21.0 | 85/15 | 32 | 20 | 0.35 | 149 | 10.8 | 5.6 |
| 34 | 1040 | 21.0 | 80/20 | 32 | 20 | 0.32 | 190 | 11.2 | 4.8 |
| 35 | 1080 | 21.0 | 70/30 | 32 | 20 | 0.27 | 223 | 11.6 | 3.9 |

As can be clearly understood from Table 4, it was confirmed that in Comparative examples 31 through 35, where the molar quantity of Pb contained is the same as that of the stoichiometric composition, the piezoelectric $d_{31}$ constant is relatively good when the percentage of Ag contained in the internal electrodes is lowered, but the amount of Ag dispersion increases and deterioration in the piezoelectric $d_{31}$ constant becomes serious in case of increasing the percentage of Ag. It was also confirmed that increasing the percentage of Ag causes grain growth and deterioration in insulation resistance.

On the other hand, it was confirmed that with the Examples 31 through 35, where the molar quantity of Pb contained is reduced by 2 mol % from the stoichiometric composition, a high piezoelectric $d_{31}$ constant of 217 to 240 pC/N could be obtained without dependence on the percentage of Ag contained in the internal electrodes. Particularly, it was confirmed that in Examples 31 through 34 wherein the weight ratio Ag/Pd was 80/20 or more, the piezoelectric $d_{31}$ constant was markedly improved in comparison with the Comparative examples 31 through 34 wherein the weight ratio was the same as in the above examples. Moreover, it was confirmed that in Examples 31 through 33 wherein the weight ratio Ag/Pd was 85/15 or more, the piezoelectric $d_{31}$ constant was even more markedly improved in comparison with the Comparative examples 31 through 33 wherein the weight ratio was the same as in the above examples, and the insulation resistion as in Example 12 and Comparative example 5, to fabricate ceramic sheets with different in thickness.

EXAMPLES 41 THROUGH 44

Ceramic sheets in a thickness of 18 to 130 μm were fabricated by the same method and procedures as in the second embodiment with the ceramic powder raw material of the same composition as in Example 12, and screen printing was performed on the ceramic sheets with an electroconductive paste for internal electrodes prepared so that the ratio by weight of Ag to Pd was 90/10, to form a layered article, of which the number of layers was between 4 to 30. Next, the layered article was stored in an alumina case, and subjected to degreasing and sintering processing at a sintering temperature of 980° C. for 4 to 32 hours, with the oxygen concentration set to 0.1 vol %, to fabricate a ceramic sintered article with unit ceramic layers of 12 to 80 μm after sintering.

Subsequently, test pieces for Examples 41 through 44 were fabricated in the same way as in the first embodiment.

COMPARATIVE EXAMPLES 41 THROUGH 44

Ceramic sheets in a thickness of 18 to 130 μm were fabricated by the same method and procedures as in the second embodiment with the ceramic powder raw material of the same composition as in Comparative Example 5, and screen printing was performed on the ceramic sheets with an electroconductive paste for internal electrodes prepared so that the ratio by weight of Ag to Pd was 90/10, to form a layered article of which the number of layers was between 4 to 30. Next, the layered article was stored in an alumina case, and subjected to degreasing and sintering processing at a sintering temperature of 980° C. for 4 to 32 hours, with the oxygen concentration set to 21.0 vol %, to fabricate a ceramic sintered article with unit ceramic layers of 12 to 80 µm.

Subsequently, test pieces for Comparative Examples 41 through 44 were fabricated in the same way as in the first embodiment.

Next, as in the second embodiment, the inventors measured the amount of Ag dispersion into the ceramic body, the piezoelectric $d_{31}$ constant, the resistivity log$\sigma$, and the grain diameter after sintering.

Table 5 illustrates the sintering temperature, oxygen concentration in the atmosphere at the time of sintering, the ratio by weight of Ag to Pd, the thickness of the ceramic sheets, the thickness of each unit ceramic layer after sintering, and the results of the above measurement, in Examples 41 through 44 and Comparative examples 41 through 44.

sheet) was the same as in the above examples. This shows that while dispersion of Ag is suppressed due to sintering in a low-oxygen atmosphere, the Pb pores generated by reduction in the molar quantity of Pb contained and a donor excess compensate for the oxygen pores generated by increase in dispersion of Ag and sintering in a low-oxygen atmosphere, so the piezoelectric $d_{31}$ constant and the insulation resistance can be markedly improved.

It was further confirmed that the grain diameter in Examples 41 through 44 was 1.8 to 2.9 µm, which was finer than the grain diameter in Comparative examples 41 through 44.

What is claimed is:

1. A method for manufacturing a monolithic piezoelectric ceramic actuator part which has a plurality of piezoelectric ceramic layers and spaced internal electrode layers disposed in said piezoelectric ceramic actuator, wherein said piezoelectric ceramic making up said piezoelectric ceramic layers is formed of a perovskite compound oxide expressed by the general formula of $ABO_3$, and comprises at least Pb for the A site component and comprises Ti or Ti and Zr for the B site component and said internal electrode layers contain Ag as a primary component; said method comprising:

TABLE 5

| | Sintering temperature (° C.) | Oxygen concentration (vol %) | Ag/Pd (Weight ratio) | Thickness of ceramic sheet (µm) | Thickness of unit ceramic layer (µm) | Ag dispersion (wt %) | $|d_{31}|$ (pC/N) | Resistivity log$\rho$ ($\Omega \cdot$ cm) | Grain diameter (µm) |
|---|---|---|---|---|---|---|---|---|---|
| Examples | | | | | | | | | |
| 41 | 980 | 0.1 | 90/10 | 130 | 80 | 0.15 | 230 | 11.8 | 1.8 |
| 42 | 980 | 0.1 | 90/10 | 64 | 40 | 0.18 | 231 | 11.8 | 2.2 |
| 43 | 980 | 0.1 | 90/10 | 32 | 20 | 0.20 | 222 | 11.7 | 2.4 |
| 44 | 980 | 0.1 | 90/10 | 18 | 12 | 0.31 | 209 | 11.5 | 2.9 |
| Comparative Examples | | | | | | | | | |
| 41 | 980 | 21.0 | 90/10 | 130 | 80 | 0.29 | 198 | 11.3 | 4.3 |
| 42 | 980 | 21.0 | 90/10 | 64 | 40 | 0.31 | 153 | 10.8 | 4.9 |
| 43 | 980 | 21.0 | 90/10 | 32 | 20 | 0.44 | 134 | 10.3 | 5.8 |
| 44 | 980 | 21.0 | 90/10 | 18 | 12 | 0.55 | 103 | 9.9 | 6.8 |

As can be clearly understood from Table 5, it has been found that in Comparative examples 41 through 44, where the molar quantity of Pb contained is the same as that of the stoichiometric composition, a relatively good piezoelectric $d_{31}$ constant can be obtained when the unit ceramic layer after sintering (or the ceramic sheet) is enough thick, but the amount of dispersion of Ag increases and the piezoelectric $d_{31}$ constant is markedly deteriorated according to reduction in the thickness of the unit ceramic layer (or thickness of the ceramic sheet). Also, it has been confirmed that according to reduction in the thickness of the unit ceramic layer (or the thickness of the ceramic sheet), grain growth becomes remarkable, and insulation resistance drops.

On the other hand, it was confirmed in Examples 41 through 44, that a high piezoelectric $d_{31}$ constant of 209 to 230 pC/N could be obtained, without dependence on the thickness of the unit ceramic layer (or thickness of the ceramic sheet). Particularly, in Examples 42 through 44 wherein the thickness of the unit ceramic layer was 40 µm or less (or the thickness of the ceramic sheet was 64 µm or less), it was confirmed that the piezoelectric $d_{31}$ constant and the insulation resistance was markedly improved in comparison with Comparative examples 42 through 44 wherein the thickness of the unit ceramic layer (or thickness of the ceramic providing a piezoelectric ceramic powdered raw material wherein the molar quantity of said A site component is reduced by about 0.5 mol % to 5.0 mol % from that of a stoichiometric composition and the average valence of said B site component of the ceramic raw material is greater than that of the stoichiometric composition and is greater than 4.000 and less than 4.100;

fabricating a layered article with said piezoelectric ceramic powdered raw material; and sintering said layered article within an atmosphere wherein the oxygen concentration is about 5% by volume or less but more than 0% by volume.

2. A method for manufacturing a monolithic piezoelectric actuator part according to claim 1, wherein the molar quantity of Pb included in said A site component has been reduced by about 0.5 mol % to 5.0 mol % from that of the stoichiometric composition.

3. A method for manufacturing a monolithic piezoelectric actuator part according to claim 2, wherein said B site component further comprises Nb.

4. A method for manufacturing a monolithic piezoelectric actuator part according to claim 2, wherein said B site component further comprises Nb and Ni.

5. A method for manufacturing a monolithic piezoelectric actuator part according to claim 2, wherein said B site component further comprises at least one of Nb, Sb, Ta and W.

6. A method for manufacturing a monolithic piezoelectric actuator part according to claim 5, wherein said B site component further comprises at least one of Ni, Cr, Co and Mg.

7. A method for manufacturing a monolithic piezoelectric actuator part according to claim 6, wherein said layered article fabrication comprises a ceramic green sheet fabrication forming said piezoelectric ceramic powdered raw material into sheet form so as to fabricate a plurality of ceramic green sheets, forming an electrode pattern on at least two of said ceramic green sheets with an electroconductive paste for internal electrodes which contains Ag as a primary component, and layering a plurality of ceramic green sheets upon which said electrode patterns have been formed so as to form a layered article.

8. A method for manufacturing a monolithic piezoelectric actuator part according to claim 7, wherein said electroconductive paste contains Ag and Pd in a ratio of at least 70/30.

9. A method for manufacturing a monolithic piezoelectric actuator part according to claim 8, wherein said electroconductive paste contains Ag and Pd in a ratio of at least 80/20 and the thickness of the ceramic layers is such that their thickness after sintering is about 64 μm or less.

10. A method for manufacturing a monolithic piezoelectric actuator part according to claim 9, wherein said electroconductive paste contains Ag and Pd in a ratio of at least 85/15 and the thickness of the ceramic layers is such that their thickness after sintering is about 40 μm or less.

11. A method for manufacturing a monolithic piezoelectric part according to claim 1, wherein said B site component comprises Ti and Zr.

12. A method for manufacturing a monolithic piezoelectric actuator part according to claim 1, wherein said B site component further comprises Nb.

13. A method for manufacturing a monolithic piezoelectric actuator part according to claim 1, wherein said layered article fabrication comprises a ceramic green sheet fabrication forming said piezoelectric ceramic powdered raw material into sheet form so as to fabricate a plurality of ceramic green sheets, forming an electrode pattern on at least two of said ceramic green sheets with an electroconductive paste for internal electrodes which contains Ag as a primary component, and layering a plurality of ceramic green sheets upon which said electrode patterns have been formed so as to form a layered article.

14. A method for manufacturing a monolithic piezoelectric actuator part according to claim 1, wherein said B site component further comprises Nb and Ni.

15. A method for manufacturing a monolithic piezoelectric ceramic audio emitter part which has a plurality of piezoelectric ceramic layers and spaced internal electrode layers disposed in said piezoelectric ceramic audio emitter part, wherein said piezoelectric ceramic making up said piezoelectric ceramic layers is formed of a perovskite compound oxide expressed by the general formula of $ABO_3$, and comprises at least Pb for the A site component and comprises Ti or Ti and Zr for the B site component and said internal electrode layers contain Ag as a primary component; said method comprising:
providing a piezoelectric ceramic powdered raw material wherein the molar quantity of said A site component is reduced by about 0.5 mol % to 5.0 mol % from that of a stoichiometric composition and the average valence of said B site component of the ceramic raw material is greater than that of the stoichiometric composition and is greater than 4.000 and less than 4.100;
fabricating a layered article with said piezoelectric ceramic powdered raw material; and
sintering said layered article within an atmosphere wherein the oxygen concentration is about 5% by volume or less but more than 0% by volume.

16. A method for manufacturing a monolithic piezoelectric ceramic audio emitter part according to claim 15, wherein the molar quantity of Pb included in said A site component has been reduced by about 0.5 mol % to 5.0 mol % from that of the stoichiometric composition.

17. A method for manufacturing a monolithic piezoelectric ceramic audio emitter part according to claim 16, wherein said B site component further comprises Nb.

18. A method for manufacturing a monolithic piezoelectric ceramic audio emitter part according to claim 17, wherein said layered article fabrication comprises a ceramic green sheet fabrication forming said piezoelectric ceramic powdered raw material into sheet form so as to fabricate a plurality of ceramic green sheets, forming an electrode pattern on at least two of said ceramic green sheets with an electroconductive paste for internal electrodes which contains Ag as a primary component, and layering a plurality of ceramic green sheets upon which said electrode patterns have been formed so as to form a layered article.

19. A method for manufacturing a monolithic piezoelectric ceramic audio emitter part according to claim 18, wherein said electroconductive paste contains Ag and Pd in a ratio of at least 70/30.

20. A method for manufacturing a monolithic piezoelectric ceramic audio emitter part according to claim 15, wherein said electroconductive paste contains Ag and Pd in a ratio of at least 80/20 and the thickness of the ceramic layers is such that their thickness after sintering is about 64 μm or less.

* * * * *